US006949716B2

(12) United States Patent
Koulik et al.

(10) Patent No.: US 6,949,716 B2
(45) Date of Patent: Sep. 27, 2005

(54) PROCESS FOR TREATING WITH AN ATMOSPHERIC PLASMA ELECTRICALLY CONDUCTIVE MATERIALS AND A DEVICE THEREFOR

(75) Inventors: Pavel Koulik, Blaesheim (FR); Anatolii Saitchenko, Illkirch-Graffenstaden (FR); Naïl Musin, Illkirch-Graffenstaden (FR)

(73) Assignee: APIT Corp. S.A., Sion (CH)

( * ) Notice: Subject to any disclaimer, the term of this patent is extended or adjusted under 35 U.S.C. 154(b) by 138 days.

(21) Appl. No.: 10/399,414

(22) PCT Filed: Nov. 12, 2001

(86) PCT No.: PCT/IB01/02121

§ 371 (c)(1),
(2), (4) Date: May 8, 2003

(87) PCT Pub. No.: WO02/39791

PCT Pub. Date: May 16, 2002

(65) Prior Publication Data

US 2004/0026385 A1 Feb. 12, 2004

(30) Foreign Application Priority Data

Nov. 10, 2000 (EP) .......................................... 00811065

(51) Int. Cl.[7] .............................................. B23K 9/02
(52) U.S. Cl. .............................. 219/121.59; 219/121.56
(58) Field of Search ...................... 219/121.11, 121.36, 219/121.58, 121.48, 121.59, 121.54, 121.56, 121.52; 373/18, 20, 22; 315/111.21, 111.31, 111.41

(56) References Cited

U.S. PATENT DOCUMENTS

| 3,050,616 | A |   | 8/1962  | Gage |
| 3,940,641 | A | * | 2/1976  | Dooley ................. 219/121.36 |
| 3,989,512 | A |   | 11/1976 | Sayce |
| 5,548,611 | A | * | 8/1996  | Cusick et al. ................. 373/18 |
| 6,278,241 | B1 | * | 8/2001 | Enguelcht et al. ...... 315/111.21 |

FOREIGN PATENT DOCUMENTS

| EP | 0630087 A | 12/1994 |
| JP | 11 106947 A | 4/1999 |
| JP | 11 222530 A | 8/1999 |
| WO | WO 97 18693 | 5/1997 |
| WO | WO 97 18694 A | 5/1997 |

* cited by examiner

Primary Examiner—Tu Hoang
(74) Attorney, Agent, or Firm—Clifford W. Browning; Woodard, Emhardt, Moriarty, McNett & Henry LLP

(57) ABSTRACT

Process for the surface treatment of an object made of an electrically conductive material, with an atmospheric plasma, including the generation of plasma jets by plasma generators, the application of the plasma jets to a surface of the object to be treated, and the relative displacement of the object relative to the plasma generators. At least one of the plasma jets is a cathodic jet and at least one of the plasma jets is an anodic jet. The anodic jet is applied to a treatment zone on the surface to be treated in the proximity of the cathodic jet.

53 Claims, 14 Drawing Sheets

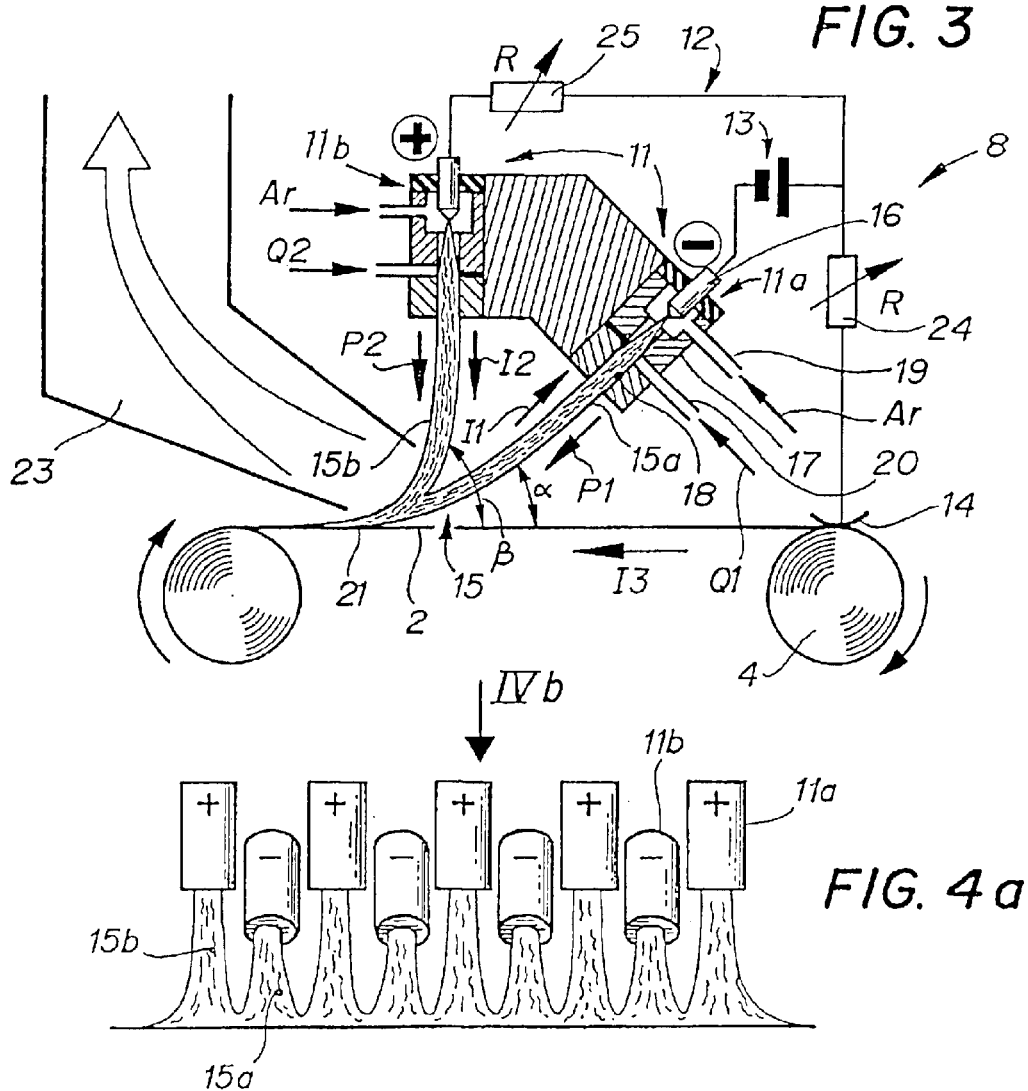
FIG. 3
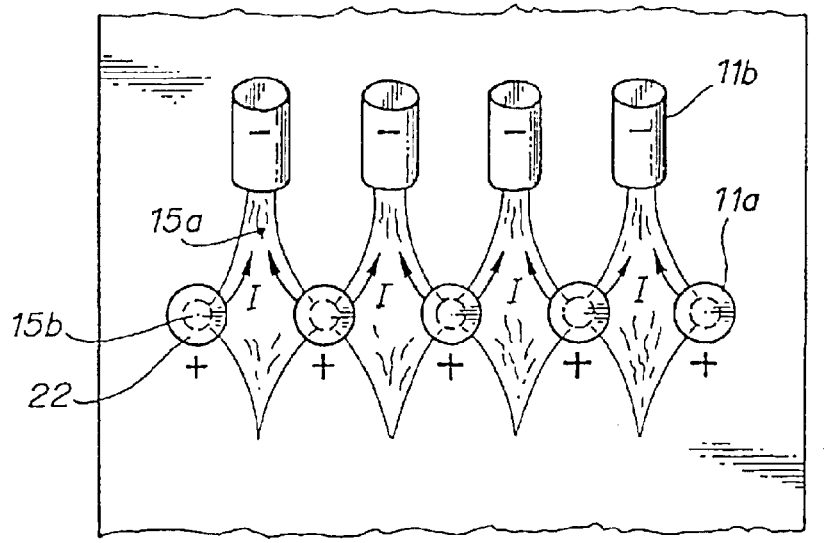
FIG. 4a
FIG. 4b

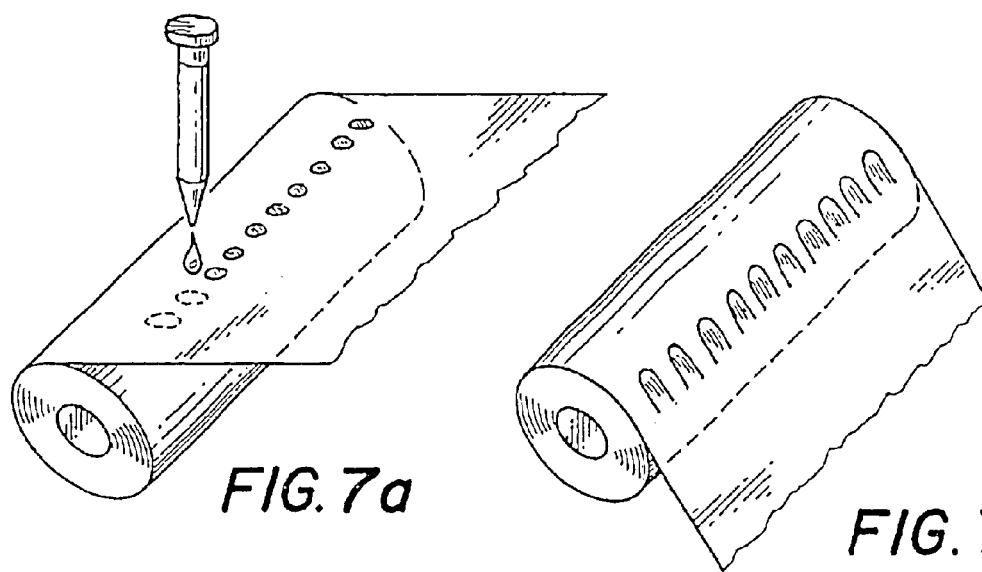
FIG. 7a
FIG. 7b
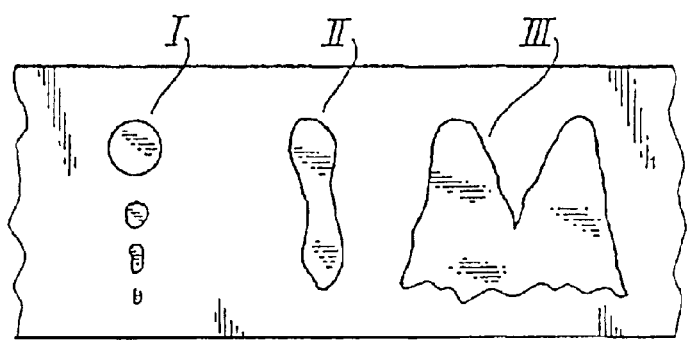
FIG. 7c
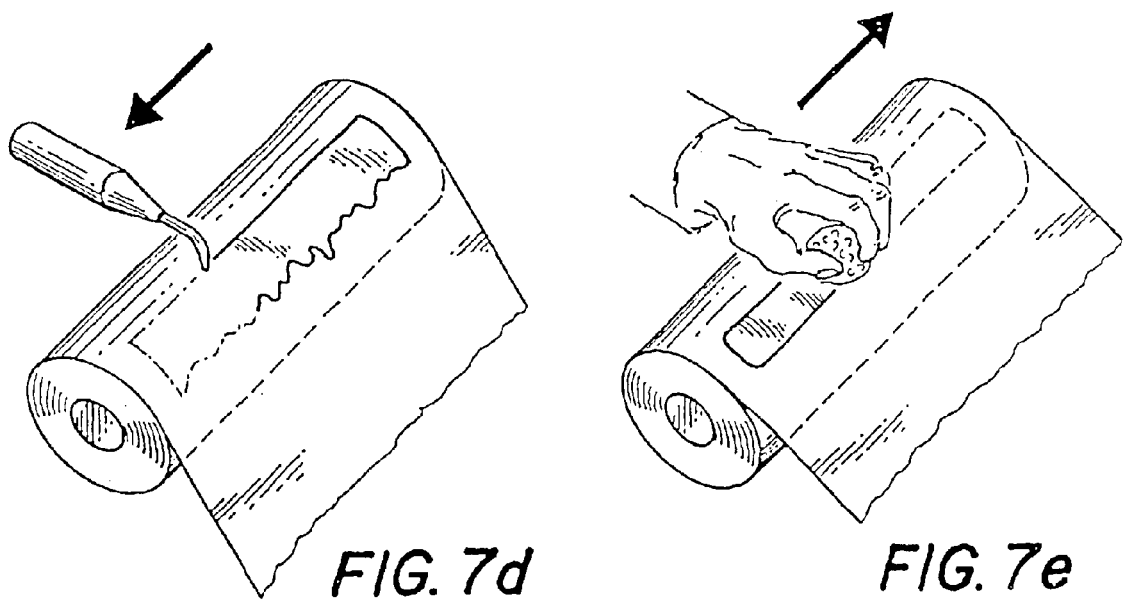
FIG. 7d
FIG. 7e

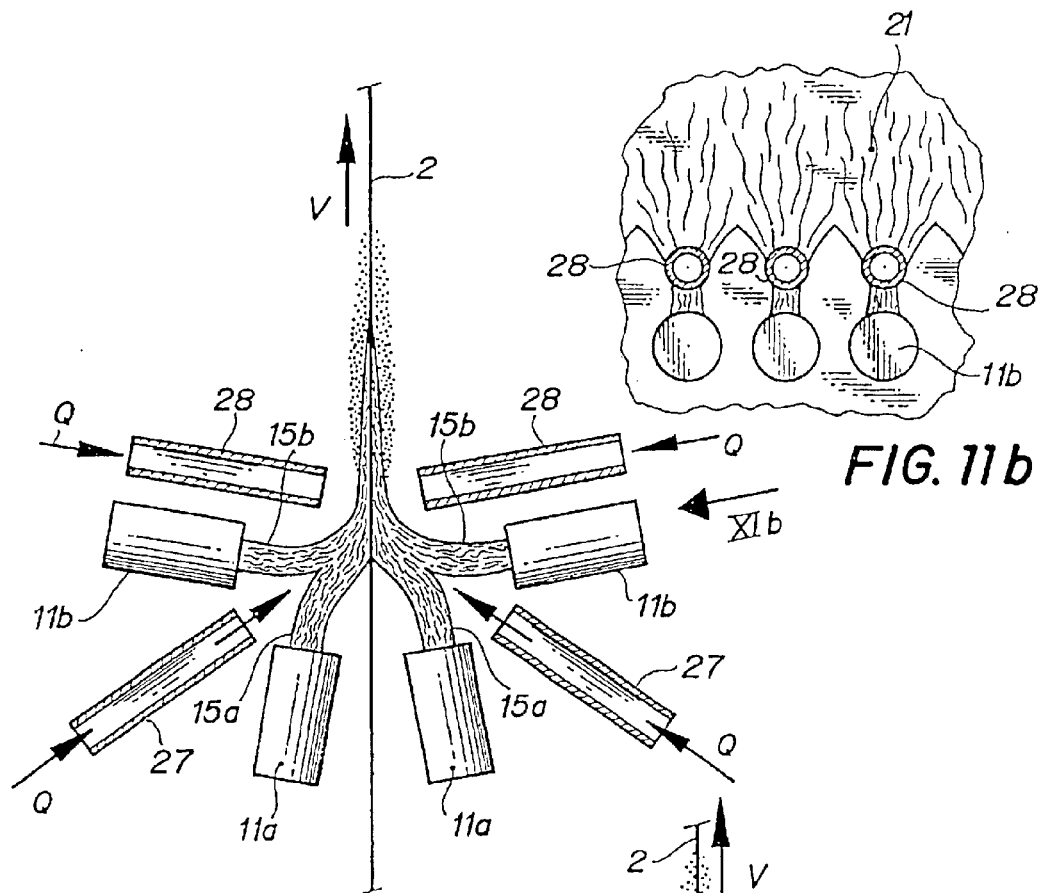
FIG. 11a
FIG. 11b
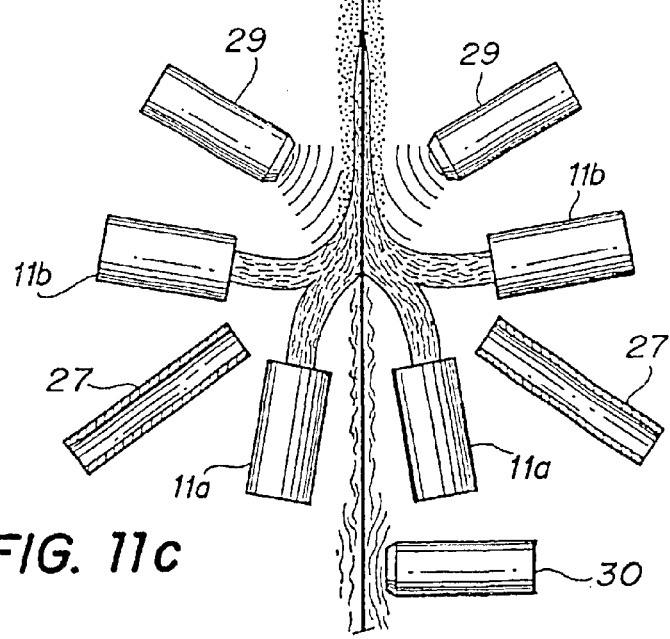
FIG. 11c

PROCESS FOR TREATING WITH AN ATMOSPHERIC PLASMA ELECTRICALLY CONDUCTIVE MATERIALS AND A DEVICE THEREFOR

This application is the U.S. national stage of PCT International Application No. PCT/IB01/02121, which claimed priority to prior European Patent Application No. 00811062.2, filed Nov. 10, 2000.

BACKGROUND OF THE INVENTION

The present invention is concerned with a process for treating with a plasma objects made of electrically conductive materials. The invention is concerned, in particular, with the treatment by an atmospheric plasma of objects having the shape of foils or wires, for example after their rolling or drawing.

The treatment of a material can include one or several of the following operations:

Cleaning one or of two faces of a foil or of a wire, to remove organic residues and technological oils and greases.

Deodorising.

Disinfecting, sterilising.

Activating the surface for improving the adhesive properties or the wettability.

Modifying the surface layer by fusing micro-cracks, polishing or forming a superficial alloy.

Stripping.

Annealing, elimination of internal stresses.

Depositing films.

It is known how to use processes and devices for the cleaning of surfaces of rolled foils or of wires to remove therefrom the remains of the greases used in their manufacture. The treatment devices, the most frequently used, are diffusion furnaces, gas burners, chemical baths, steam jets, devices producing electrical discharges of the barrier type or silent discharges and plasma jet devices.

The drawbacks of diffusion furnaces, for the cleaning of metal foils, whether they use air or oxygen, is that they have high electrical power requirements and their action is very slow. Days, if not weeks, are needed for a completely cleaning of the foils that are normally loaded into the furnace in the form of rolls. The process consists in heating the roll, in making air or oxygen penetrate between the layers of the foil in order to oxidise the organic residue and to remove, mainly by diffusion, the residual gas from between the layers of foil tightly pressed one upon the other in the roll. Accordingly, the productivity and the efficiency of such furnaces is low. The diffusion furnaces are only used for the cleaning and the annealing of materials.

Linear flame burners are little used, owing to their low efficiency and to the limited variation of the composition of the flame containing carbonic products. Flame burners are generally used only for the cleaning and for the annealing of materials.

Chemical baths use considerable amounts of chemical products, and these products need to be recycled. The process has its limitations, due to the high cost of recycling and the need to comply with increasingly strict ecological standards.

Steam jets are used for the cleaning of wires. This cleaning, given its low efficacy, is used practically only for a preliminary coarse cleaning operation, which is generally followed by a chemical cleaning.

The use of discharges of the barrier type or of the silent type, which offers the advantage of a uniform treatment of the material, is not suitable for industrial purposes owing to the limited productivity of these processes.

The treatment by atmospheric plasma jets is relatively effective, since a highly activated gas carries out this treatment and the oxidation is the result of a plasmo-chemical reaction. Furthermore, the productivity is high, owing to the high power density achievable. The plasma jet treatment devices are generally simple, inexpensive and adaptable. Also, one can carry out a cleaning of a surface, an annealing, a stripping or a deposition of a film, the composition of the plasma gases being adapted to the treatment to be carried out.

A disadvantage of the processes using plasma jets is that it is difficult to achieve a uniform treatment over the whole surface of the foil or of the wire.

To remedy this drawback, some authors have tried to design devices using linear plasmatron assemblies, to create plasma curtains.

For example, in the publication WO 97/18 693, a plasma generator is described, which generates a plasma having the shape of a curtain, by superposing several jets produced from several plasmatrons having two nozzles. The drawback of this process is that the desirably uniform distribution of the parameters, such as the temperature, cannot be achieved in most industrial applications of interest. Actually, the flow of gas through the plasmatrons and the speed distribution do not make it possible to obtain, in all cases, the desired uniform distribution of the parameters. Even when the temperature is uniform over the whole length of the curtain, this does not necessarily imply that the speed and/or the composition of the plasma will be uniform, and this results in a lack of uniformity of the treatment.

Furthermore, since the use of this type of linear plasma generator for the treatment of metal foils necessitates a rapid passage of the foil through the plasma curtain, the moving foils drag along an important flow of gas or of air. This turbulent flow of gas interferes with the flow of the plasma, with the result that the plasma is cooled, looses its energy that is in the form of potential energy of its particles and becomes turbulent. The efficiency of the treatment is strongly decreased by the cooling. The turbulence can cause deformations of the foil being treated, such as crumpling, mainly in the case of thin foils.

SUMMARY OF THE INVENTION

An object of the present invention is to improve the uniformity of the treatment brought about by a plasma treatment process, in particular for industrial applications involving the treatment of objects having important surface areas, in particular foils or items such as wires, requiring very high treatment speeds, and to provide a device for carrying out these processes.

It would be desirable to provide a plasma treatment process and a device for carrying out this process, which could be used, in particular, for the treatment of foils or of wires of conductive materials, which would be reliable, fast and inexpensive.

Furthermore, it would be desirable to provide a process and a device for carrying out this process, which could be used for an operation such as cleaning, annealing, deposition of films, surface activation, stripping and sterilisation, or a combination of such operations.

In the present invention, a process for the treatment with an atmospheric plasma of an object to be treated, made of an electrically conductive material, includes the generation of plasma jets by plasma generators, the application of the plasma jets to a surface to be treated of the object to be treated, and the relative displacement of the object to be treated with respect to the plasma generators, characterised in that, at least one of the plasma jets is a cathodic jet and at least one of the plasma jet is an anodic jet, the anodic jet being applied to a treatment zone on said surface to be treated in the proximity of the cathodic jet. The process according to the invention can, advantageously, be applied to manufactured objects produced by a continuous process or having large surfaces, such as metal foils, metal wires or car body parts made from metal sheets.

The electrical current for the generation of cathodic and anodic plasma jets is divided into three parts, one, $I_3$, flowing through the object to be treated and the two others, $I_1$, $I_2$ being fed to the anodic and to cathodic plasma jets.

Advantageously, the cathodic jet forms an angle α with the surface to be treated which is acute and the anodic jet forms with the surface to be treated an angle β which is greater than the angle α formed between the cathodic jet and the surface to be treated. In an alternate version, the angle β between the anodic jet and the surface to be treated approaches or is substantially equal to 90° and the angle α formed between the cathodic jet and the surface to be treated is between 25° and 60°.

Preferably, the power of the impulse of the cathodic jets is higher than that received by the anodic jets.

The process according to the invention makes it possible to obtain a good uniformity of the treatment, owing to the fact that a very special motion is ensured for the anodic spots along the surface to be treated. The motion of the anodic spots makes it possible to decrease the influence of the boundary layer formed on the treated surface. The uniformity of the treatment is improved, on the one hand, by the displacement of the anodic spots due to the heating of the boundary layer and, on the other hand, to the displacement of the spots under the effect of their own magnetic field. The transverse delocalisatin of the electrical currentenables the uniform transversal distribution of the thermal and plasmo-chemical treatment over the entire treated surface.

The use of the cathodic and of the anodic spots in the process proper of treating the foil or the wire by the plasma makes it possible to increase the thermal efficiency of the process.

The device for carrying out the process according to the invention includes, at least one cathodic plasma jet generator and at least one anodic plasma jet generator, arranged in such a manner that the anodic jet is applied to a treatment zone of the surface to be treated, in the proximity of the cathodic jet.

The electrical circuit of the device for supplying the plasma jets includes a loop that is closed by a portion of the object to be treated, and a means for varying the electrical current $I_3$ flowing through the object to be treated.

The plasma jets of the plasma generators can be inclined at an acute angle γ with respect the direction of motion of the object to be treated, relative to the plasma generator, in order to increase the surface area of application of the plasma on the surface to be treated for achieving a good uniformity for the transverse treatment.

One can also achieve transversally a good uniformity of treatment, by generating an alternating magnetic field in such a manner that the resulting Ampere forces cause a sweeping oscillation of the plasma jets. The frequency v of the oscillations of the magnetic field is preferably equal to or higher than the ratio of the relative speed of motion of the object to be treated to the diameter of the plasma jets.

Advantageously, the treatment device can include one or several jets of reactive gas directed onto the plasma jets in such a manner as to widen or to compress the plasma jets directed against the object to be treated and, accordingly, to improve the uniformity of the treatment.

According to one advantageous aspect of the invention, acoustic or ultrasonic vibrations are generated on the object to be treated during the application of the plasma, by an external vibrations generator or by a plasma generation process creating, for instance, shock waves or acoustic waves having frequencies close to the resonance frequencies of the object to be treated. Shock waves can be created, by generating the plasma with electrical pulses, wherein the duration of the leading edge of the current amplitude of the supplied electrical pulses is sufficiently short for the process of increase of the current amplitude to be isochoric. The frequency of the supplied electrical pulses is, preferably, close or equal to the frequency of the acoustic vibrations.

In an embodiment for treating wires, the cathodic and the anodic jets can be arranged to form a funnel along the axis on which the treated wire moves.

In an embodiment for the treatment of foils, the installations for the treatment can be provided upstream of the plasma application zone, with a device for stabilising the flow of air including baffles which can be actuated by a mechanism enabling the adjustment of their positions and, accordingly, a dosing of the quantity of air separated from the foil to be treated. The device can also be provided downstream of the plasma application zone, with cooled baffles producing a laminar flow.

Advantageously, the laminar nature of the flow of the air dragged by the foil to be treated makes it possible to avoid any crumpling of the foil and increases substantially the efficiency of the plasma treatment.

The cathodic and the anodic generators can alternate in the transverse direction of the foil or of the wire to be treated, in such a manner that the axis of each one of the generators of a given polarity is at an equal distance from the axes of the two neighbouring generators, both of the opposite polarity.

The treatment installation can include two identical plasma generators, positioned one on each side of the foil of the conductive material, in such a manner as to treat simultaneously or in sequence the two faces of this foil.

Other objectives and the advantageous features of the invention will become apparent from the claims, from the following description of embodiments of the invention and from the appended drawings.

BRIEF DESCRIPTION OF THE DRAWINGS

FIG. 3 is a simplified cross-sectional view of a treatment device using plasma jets according to the invention;

FIG. 4a is a front view along a direction parallel to the plane of the foil to be treated, showing the arrangement of the electrodes and of the plasma jets;

FIG. 4b is a view in the direction of the arrow IVb of FIG. 4a;

FIGS. 7a to 7d are illustrations of the treated foils, to which a wettability test is applied;

FIG. 7e illustrates a treated foil, subjected to a purity test after the treatment;

FIG. 10a is a simplified perspective view of an installation for the plasma treatment of wires, according to the invention;

FIG. 10b is a simplified cross-sectional view of a plasma treatment installation for the treatment of wires according to FIG. 10a;

FIG. 11a illustrates the arrangement of plasma generators for the treatment of a metal foil according to a version, in which one part of the treatment gases is directed between the plasma jets and another part is directed to a downstream part of the plasma jets in the treatment zone, in such a manner as to compress the flow of plasma directed against the surface to be treated and to broaden its trailing side;

FIG. 11b is a partial view in the direction XIb of FIG. 11a;

FIG. 11c illustrates an arrangement of the plasma generators for the treatment of a metal foil according to an embodiment of the invention, including external generators of acoustic vibrations, in particular ultrasonic;

FIG. 12a is a simplified cross-sectional view of an embodiment of an installation for the treatment of foils, including plasma treatment devices, a stabilisation device for the air streams, and hydrodynamic bearings, according to the invention;

FIG. 12b is a partial view of a bearing of the embodiment according to FIG. 12a;

FIG. 13b illustrates the arrangement of the plasma generators of the embodiment according to FIG. 13a; and FIG. 13c is a partial cross-sectional view of a plasma generator of the embodiment according to FIG. 13a.

DETAILED DESCRIPTION OF THE INVENTION

Figure 1:
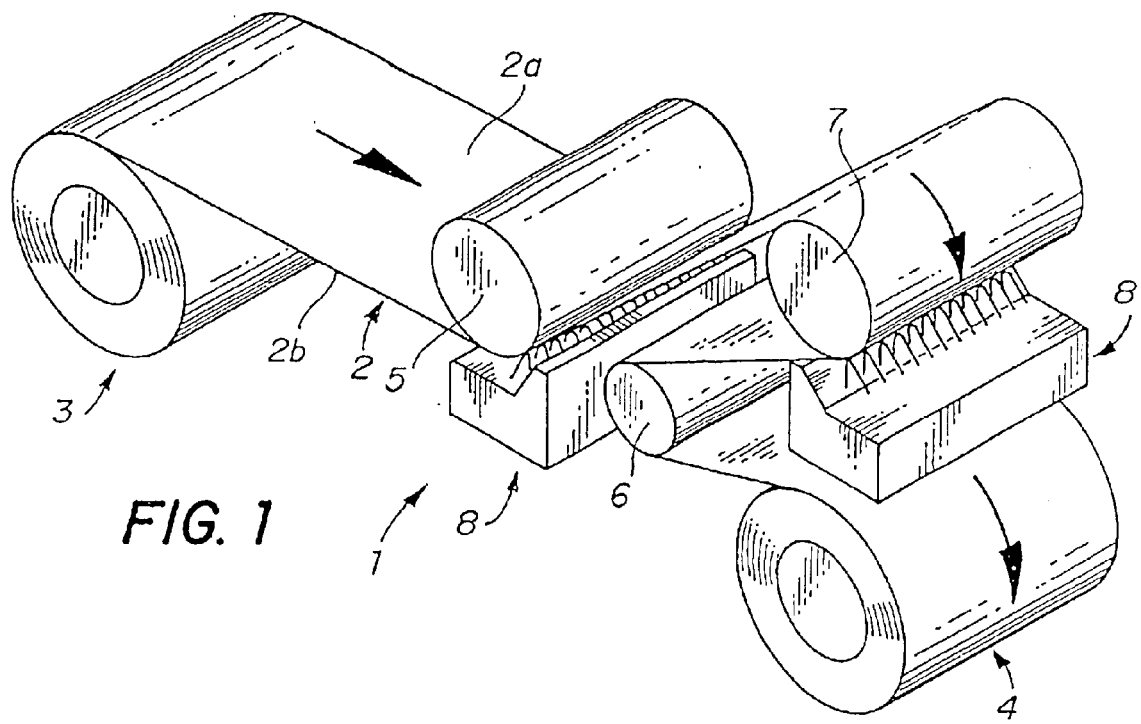
FIG. 1 is a simplified perspective view of an installation for the treatment of foils, including plasma treatment devices according to the invention.
Figure 2:
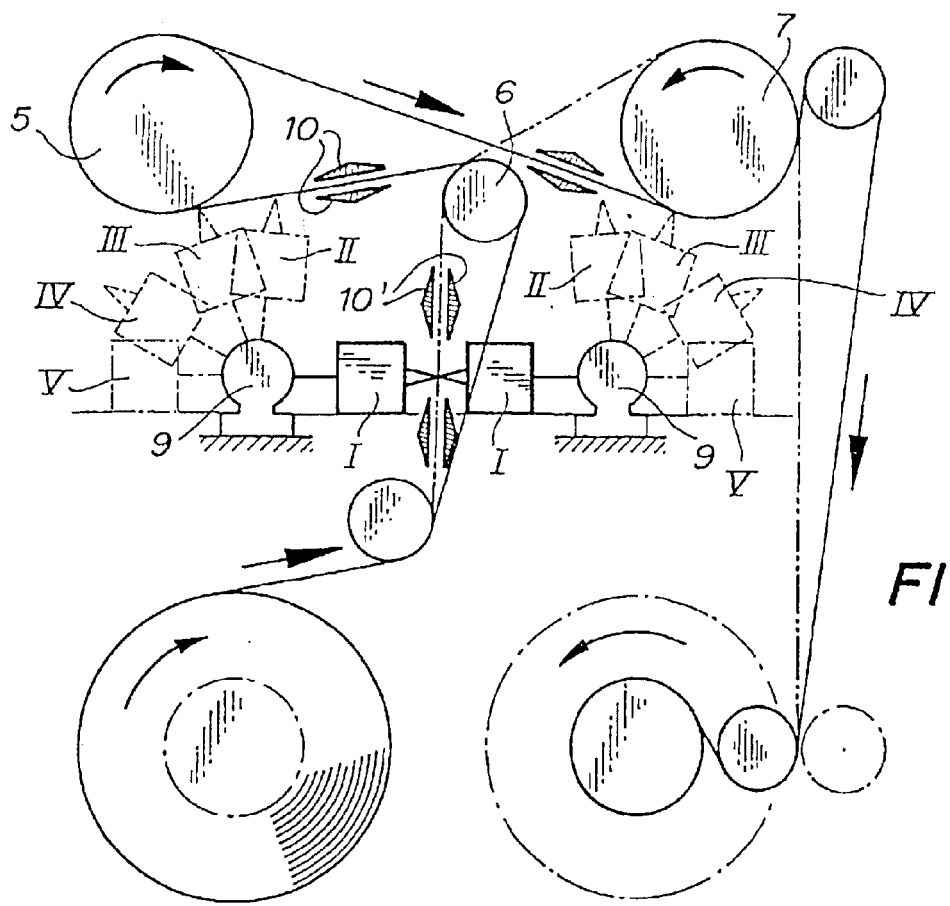
FIG. 2 is a simplified cross-sectional view of an installation for the treatment of foils, including plasma treatment devices according to the invention.

FIGS. 1 and 2 show, in a simplified manner, a part of an installation for the treatment of foils, for example of aluminium foils, obtained by a rolling process and provided as a roll 3 mounted rotatably in the installation. The foil 2 is held taut between the feeder roll 3 and a receiver roll 4, via a circuit of guide rollers 5, 7 and of tensioning rollers 6, mounted rotatably, some on springs to exert a precise tensioning force on the aluminium foil. Some of the guide rollers 5, 7 also function to position the aluminium foil with respect to the plasma jet treatment devices 8, 9. The installations shown in FIGS. 1 and 2 include, at least, two plasma jet treatment devices 8, 9, which make it possible to treat the two faces 2a, 2b of the foil 2. The installation can include two or more series of plasma generators or of treatment devices, arranged in succession along one side of the foil, each device including at least, one cathodic generator and, at least, one anodic generator.

As illustrated in FIG. 2, the plasma jet treatment devices can be mounted on a moving device 9, which makes possible, for example, the rotation of the treatment device about an axis which is substantially parallel to the axis of the rollers, thus enabling the plasma jet treatment device, to assume different positions with respect to the foil to be treated. Position I corresponds to a position suitable for the treatment of the opposite faces of a foil 2' (moving along the phantom line), wherein two treatment devices 8a, 8b are placed one on each side of the foil. Positions II and III correspond to different angles for the treatment of a foil 2 on the opposite sides of said foil by plasma jet treatment devices arranged in the vicinity of two guide rollers 5, 7. Position IV is a position of disengagement from the foil to be treated, for starting the installation, in particular for switching on the plasma jets. Position V is a position of disengagement enabling maintenance and repair work to be carried out on the plasma jet treatment device.

The installation can furthermore include devices 10 for the stabilisation of the air flow, which are arranged upstream of the working positions II, III of the plasma jet treatment devices, in the vicinity of the surface of the foil to be treated. Preferably, two members 10 are placed one on each side of the foil to be treated, for the purpose of stabilising the flow of air dragged along by the motion of the foil, in particular, to make this flow laminar, so that this flow of air disturbs only the least possible the stream of the plasma jets. Furthermore, the stabilisation members 10 reduce the movements of the foil caused by turbulence, which prevents any possible crumpling of the foil. The stabilisation members 10 are provided as baffles, of which the position with respect to the foil can be adjusted, in such a manner as to increase or decrease the flow of air dragged along by the foil. This also makes it possible to adjust the plasma treatment by supplying the same with more or less air. One can also position other stabilisation members 10' downstream of the plasma jet treatment devices or in other positions along the foil, to make the flow of air laminar in order to prevent any crumpling of the foil.

Referring to FIG. 3, the plasma jet treatment device 8 includes plasma jet generators 11 provided with electrodes connected to an electrical circuit 12 including a source of electrical energy 13 for plasma generation. The generators 11 are connected electrically via ballast resistors 24, 25 to the foil to be treated, for example via a contact 14 on the guide roller 5, 7. The foil 2 to be treated is conductive and is part of a loop of the electrical circuit including the plasma jets 15. The electrical current, flowing through the object to be treated, can be varied by means of the resistor 24 and it can even be cancelled.

In this embodiment, there are two series of plasma jet generators 11a, 11b of opposite polarities, namely a series of anodic plasma jet generators 11b and a series of cathodic plasma jet generators 11a. The plasma jet generators of each of the series 11a, 11b are arranged substantially along a line, while being juxtaposed. The plasma jet generators of one series are, preferably, offset in such a manner as to form a staggered arrangement with the generators of the other series, as illustrated in FIGS. 4a and 4b.

Each plasma jet generator includes an electrode 16 mounted inside a body 17 and a channel 18 formed in the body 17, to canalise the plasma jet. The channel is connected to inflow channels 19, 20 for the treatment gas. In this example, two inflow channels for the treatment gas are shown, but other inflow channels for the treatment gas, opening into the plasma jet channel 18, can also be provided. A first inflow channel 19 is situated approximately at the level of the electrode and a second inflow channel 20 is situated downstream of the first one.

The body 17 can be provided with a cooling circuit (not illustrated), in which would circulate a coolant for cooling the plasma generators.

The treatment gas, injected into the first inflow channel 19, is preferably a gas which is inert, such as argon (Ar) which, on the one hand, makes it possible to surround and protect the electrodes 16 against oxidation and, on the other hand, facilitates the plasma generation. The other downstream channels 20 can be used for injecting a stream of additional gas, such as air, argon, oxygen, nitrogen, helium, carbon dioxide, natural gas, organo-metallic vapours, or a mixture of several thereof, depending on the treatment which is to be carried out on the foil 2. The additional gas of the first series of plasma jet generators 11a can be different from the additional gas injected into the second series of plasma jet generators 11b.

A series of plasma generators 11a is arranged in such a manner as to produce plasma jets 15a oriented approximately along a direction forming an acute angle $\alpha$ with the plane of, or the tangent to a zone 21 of the foil 2, momentarily in contact with the plasma jet 15a, the jet being advantageously oriented in the direction opposite to the motion of the foil. This arrangement of the plasma jet generators according to the invention, also illustrated in the embodiment of FIG. 5, makes it possible, advantageously, to improve the uniformity of the treatment of the foil or of the surface to be treated of other objects having a large surface area, for example plates or cylinders.

In the embodiment shown in FIG. 3, a second series of electrodes 11b is arranged so that the angle $\beta$ between the plasma jet 15b exiting from this generator and the plane of, or the tangent to the surface of the contact zone 21 is greater than the acute angle $\alpha$ of the first series of jets 15a. The angle $\beta$ of the second series of jets with respect to the surface to be treated is, advantageously, close to 90°. Preferably, the electrodes of the first series of generators are cathodes and the electrodes of the second series of generators 11b are anodes. Advantageously, the flow of gas from the generators is selected in such a manner that the plasma jet pulses 15a from the first series of generators exceed the plasma jets pulses 15b of the second series of generators 11b.

The anodic plasma jets 15b, in contact with the surface to be treated, form anodic spots 22, which release the organic products which cover the surface to be treated, after their loosening and their plasmo-chemical oxidation. These plasmo-chemical reactions produce residual gases, such as $CO_2$, which can be evacuated by a suction duct 23 arranged above the transient treatment zone 21. The flow of the current $I_3$ between the cathodic plasma jet 15a and the surface to be treated through the formation of an anodic spot 22 intensifies the heating process of the material and the plasmo-chemical destruction of the products located in the limit layer. The residual remnants are burned in the anodic plasma jet 15b, in which the composition of the treatment gas and, accordingly, of the plasma, is selected according to the nature of the residues. In particular, the treatment gas can be air or oxygen, so that the plasma may destroy the organic residues and the hydrocarbons through their oxidation.

One can clean the oxidised surface through the introduction of an additional reducing gas, such as $H_2$, to the cathodic plasma jet 15a, taking advantage of the fact that the same comes in a more intimate contact with the surface to be treated than the anodic plasma jet 15b.

The uniformity of the treatment is guaranteed by the arrangement of the anodic and of the cathodic plasma jet generators according to the present invention.

Figure 6:
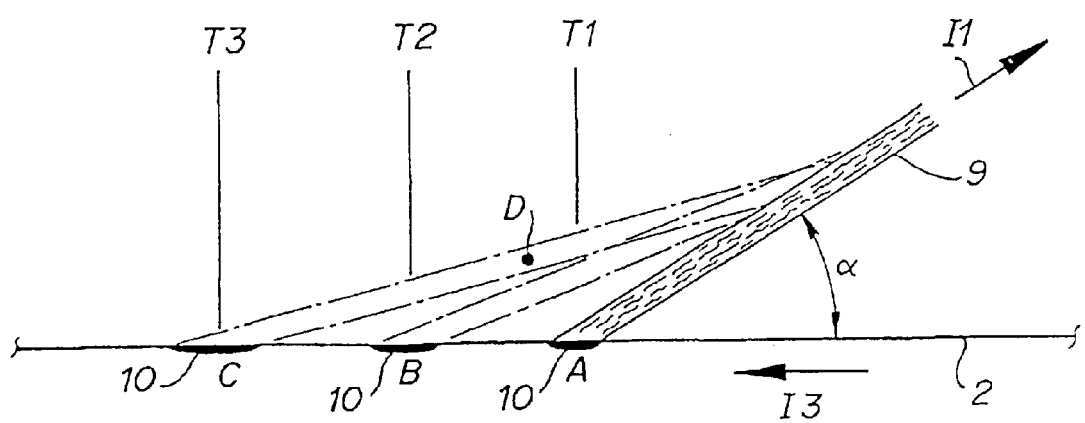
FIG. 6 is a diagram for illustrating the movement of a plasma jet directed against the surface of a foil to be treated, according to the invention.

Since the angle $\alpha$ between the surface of the foil or of the object to be treated and the cathodic plasma jet is acute, the currents $I_1$ and $I_3$ circulating, respectively, in the plasma and the foil, have directions that are opposite, which causes a repulsion therebetween. Consequently and as illustrated in FIG. 6, the plasma jets 15a and, accordingly, the anodic spots 22, move from the position A (point of time $\tau_1$) to position B (point of time $\tau_2$) and subsequently to C (point of time $\tau_3$). This process continues until when the difference of potential becomes higher than the short-circuit voltage between points A and D. This process is repeated after the short-circuit. In this manner, there is a continuous and a rapid to-and-fro movement of the anodic spot along the surface to be treated. The speed of this movement in the direction of motion of the surface to be treated (hereafter, the <<longitudinal>>) direction) is substantially higher than the speed of motion of the surface to be treated. This guarantees the longitudinal uniformity of the treatment and the absence of damage by excessive local heating.

A good uniformity of the treatment in the direction transverse, with respect to the longitudinal direction, i.e. along the plasma front, is achieved by alternating the anodic and the cathodic plasma generators, as illustrated in FIGS. 4a and 4b. The result of such a disposition is that each plasma generator is connected electrically with two generators of opposed polarity. The electrical current flows substantially uniformly along the surface to be treated, in the transverse direction with respect to its motion, which guarantees the uniformity of the treatment.

Figure 5:
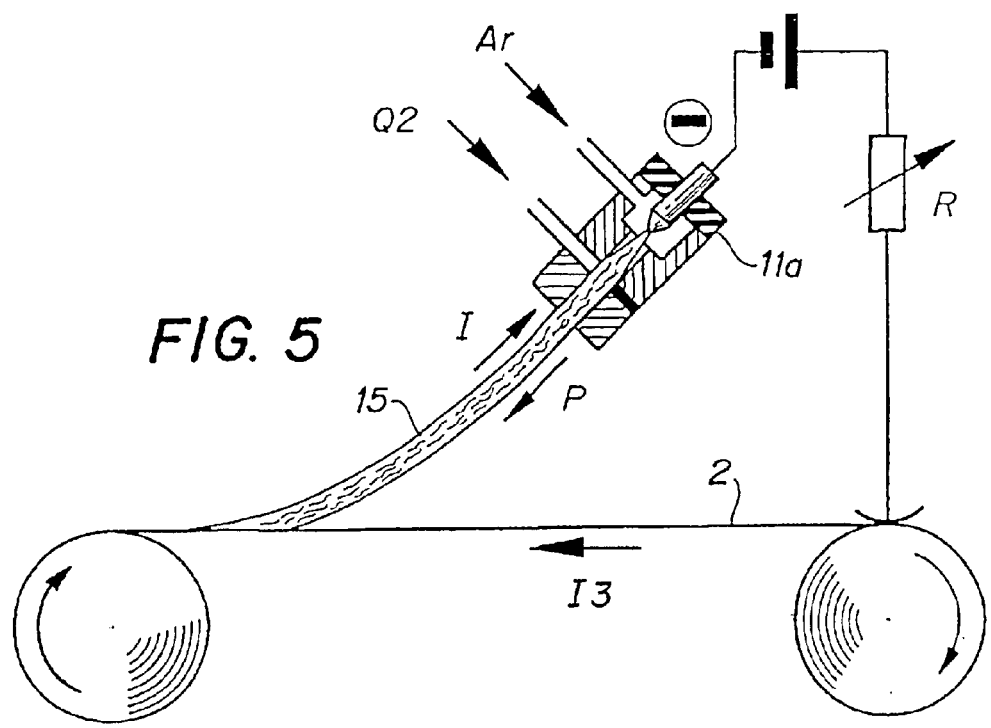
FIG. 5 is a view of a device for the treatment of foils by plasma jets, without anodes.

When a cleaning of the surface is not necessary or when only a thermal treatment is needed, for example an annealing, a fusion of the micro-cracks or a surface polishing, cathodic plasma generators are preferably used, as shown in FIG. 5.

Figure 4C:
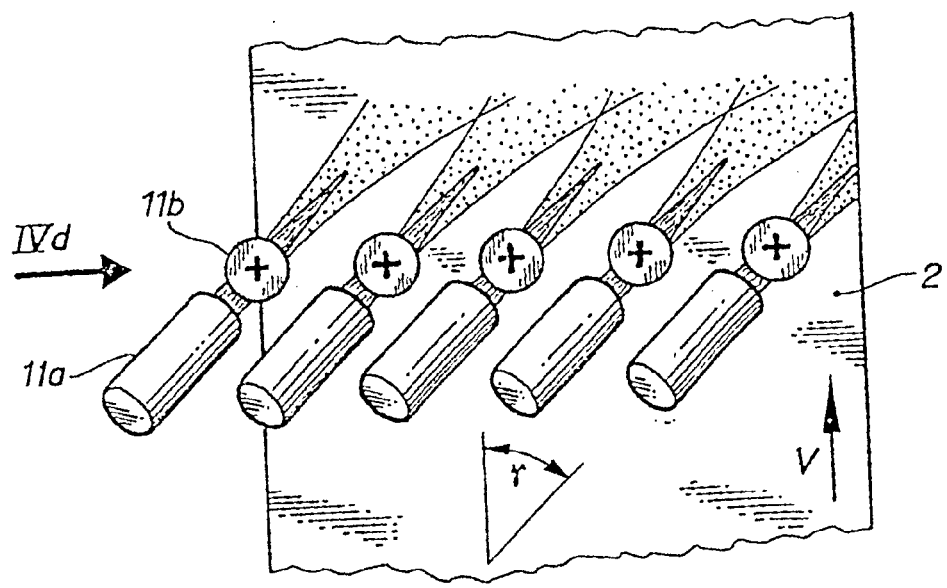
FIG. 4c is a view in a direction perpendicular to the plane of a foil to be treated, showing the arrangement of the electrodes and of the plasma jets according to an alternate version of the embodiment illustrated in FIG. 4b.
Figure 4D:
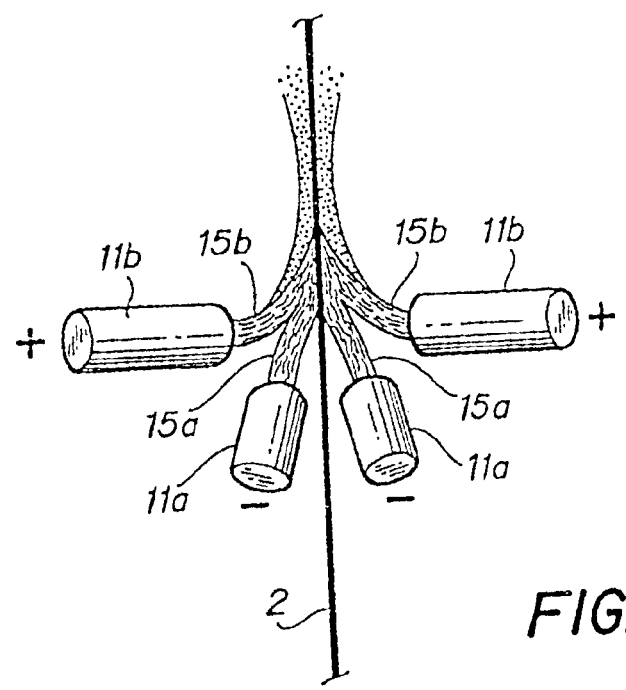
FIG. 4d is a view taken along the direction of the arrow IVd of FIG. 4c.
Figure 4E:
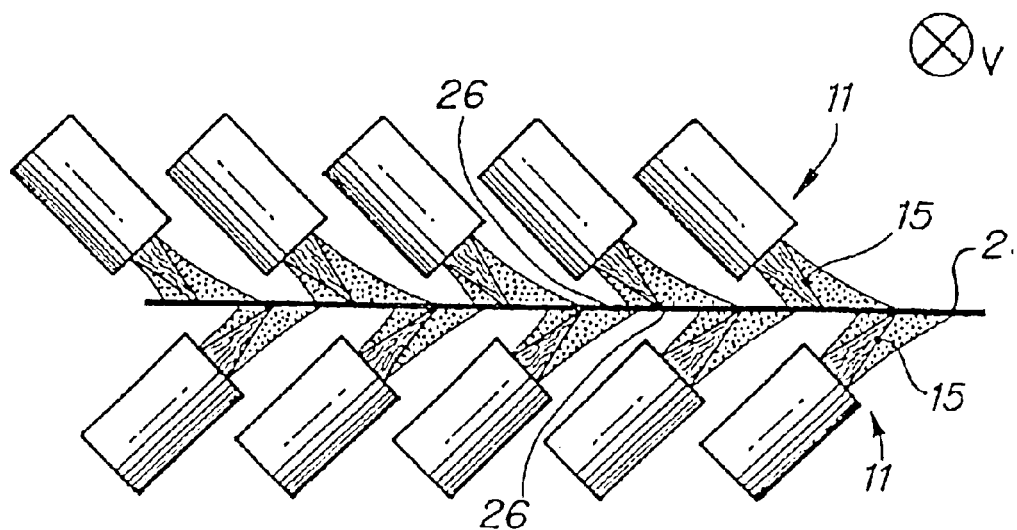
FIG. 4e is a view in a direction parallel to the plane of a foil to be treated, illustrating the arrangement of the electrodes and of the plasma jets, on both sides of the foil, according to one embodiment of the invention.
Figure 4F:
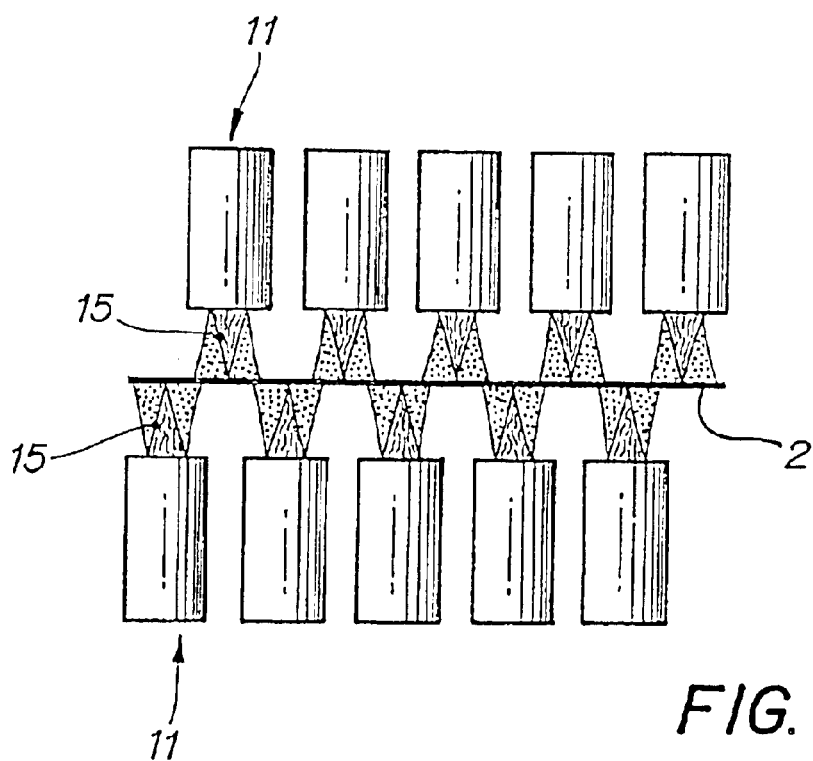
FIG. 4f is a view taken along a direction parallel to the plane of a foil to be treated, showing the arrangement of the electrodes and of the plasma jets on both sides of the foil, according to an alternate version of the embodiment shown in FIG. 4e.

The treatment of the two faces of the foil of material can be carried out by means of at least two series of plasma generators placed each one on one side of the foil, as shown in FIG. 1 or in FIG. 2 and in FIGS. 4d to 4f.

The plasma generators 11 of each side of the foil 2 to be treated can be placed either facing each other as shown in FIG. 4d, or offset as shown in FIGS. 4e and 4f. In those versions in which the plasma generators 11 are offset, the intermediate zones 26 between two generators, on the same side of the foil, are, advantageously, heated by the plasma jets 15 of the other side of the foil and conversely, which improves the treatment.

In the version of FIGS. 4c and 4d, the axes of the cathodic generators slant at an angle γ with respect to the direction of motion v of the foil to be treated, in such a manner as to increase the surface of application of the plasma jets on the surface to be treated, i.e. to increase the treatment zone, which improves the uniformity of the treatment. In practice, the angle γ can vary between 30° and 60° but is, advantageously, of 45°.

The deposition of films can be achieved by adding gases or vapours of reactive products, for example, a gaseous mixture containing organo-metallic vapours to the additional gas Q1, Q2 or directly into the contact zone 21 of the plasma with the surface to be treated.

Further, the invention makes it possible to carry out other operations, such as polishing, elimination of superficial cracks and stripping of thin electrically conductive foils.

Depending on the parameters of the conductive foil to be treated, such as its speed and its thickness and depending on the requirements of the treatment (for instance, cleaning or degreasing without annealing, degreasing with annealing, annealing of different intensities), the treatment can be applied to the two faces of the foil simultaneously or in sequence or, further, on each one of the faces upon their contact with a cooled support, for example a metal roller. These embodiments are illustrated in FIG. 2, which shows an example of a device enabling the different treatments mentioned above, owing to a rotational mechanism which makes it possible to set the plasma jet treatment device in different positions (I, II, III) with respect to the metal foil to be treated. This mechanism also has two positions, respectively IV and V, for starting the plasma generator and for allowing maintenance and repair work, when needed. Depending on the different modes of treatment, different winding up systems are provided.

Referring to FIG. 11a, a better efficiency for the treatment can be achieved when the additional gases Q are supplied by conduits 27 along a direction which is close to the bisectrix of the angle formed by the cathodic jets 15a and the anodic jets 15b.

In order to achieve a good uniformity for the treatment, one could, advantageously, introduce the additional gases immediately upstream of the impact of the plasma jets 15a, 15b on the foil to be treated, through conduits 28. The gases projected on the foil to be treated enrich the same with reactive particles and further, they force the plasma to spread in such a manner as to cover a treatment zone 21 which is broader than the zones directly sprayed by the plasma jets, as illustrated in FIGS. 11a and 11b.

In another embodiment of the present invention, which is shown in FIG. 11c and which is aimed at achieving an increased efficiency of the interaction between the plasma and the surface to be treated, the same is vibrated by one or several generators 29, 30 of acoustic vibrations, arranged upstream and/or downstream of the treatment zone. The frequencies are advantageously in the ultrasound domain. The effect of the vibrations is to increase the interaction between the surface to be treated and the plasma, in a manner similar to an increase in temperature, owing to the increase in the kinetic energy of the atoms of the surface to be treated. Further, the vibrations of the surface to be treated improve the plasmo-chemical reactions between the additional gas of the plasma and the surface to be treated, by improving the evacuation and the replacement of the gas present on the surface to be treated.

The acoustic vibrations can also be generated by the plasma itself, by supplying the plasma arc with a pulsed current, either unipolar or alternating. The duration of the leading edge of the pulses is selected in such a manner that the plasma develops first in an isochoric manner so as to produce, at each pulse, a shock wave, which will transmit its kinetic energy to the surface to be treated, in the form of vibrations. Advantageously, the frequency of repetition of the pulses of the electrical current producing the plasma is chosen to correspond to the frequency of vibration of the surface to be treated. When these pulses generate acoustic vibrations, the authors of the present invention have found that the plasma <<sings>>. The apparition of this <<singing>> is automatically accompanied by a substantial increase in the efficiency of the treatment. The intensity and the frequency of the surface oscillations of the treated surface are controlled in the present invention by means of a detector of acoustic or of ultrasonic vibrations.

Figure 9:
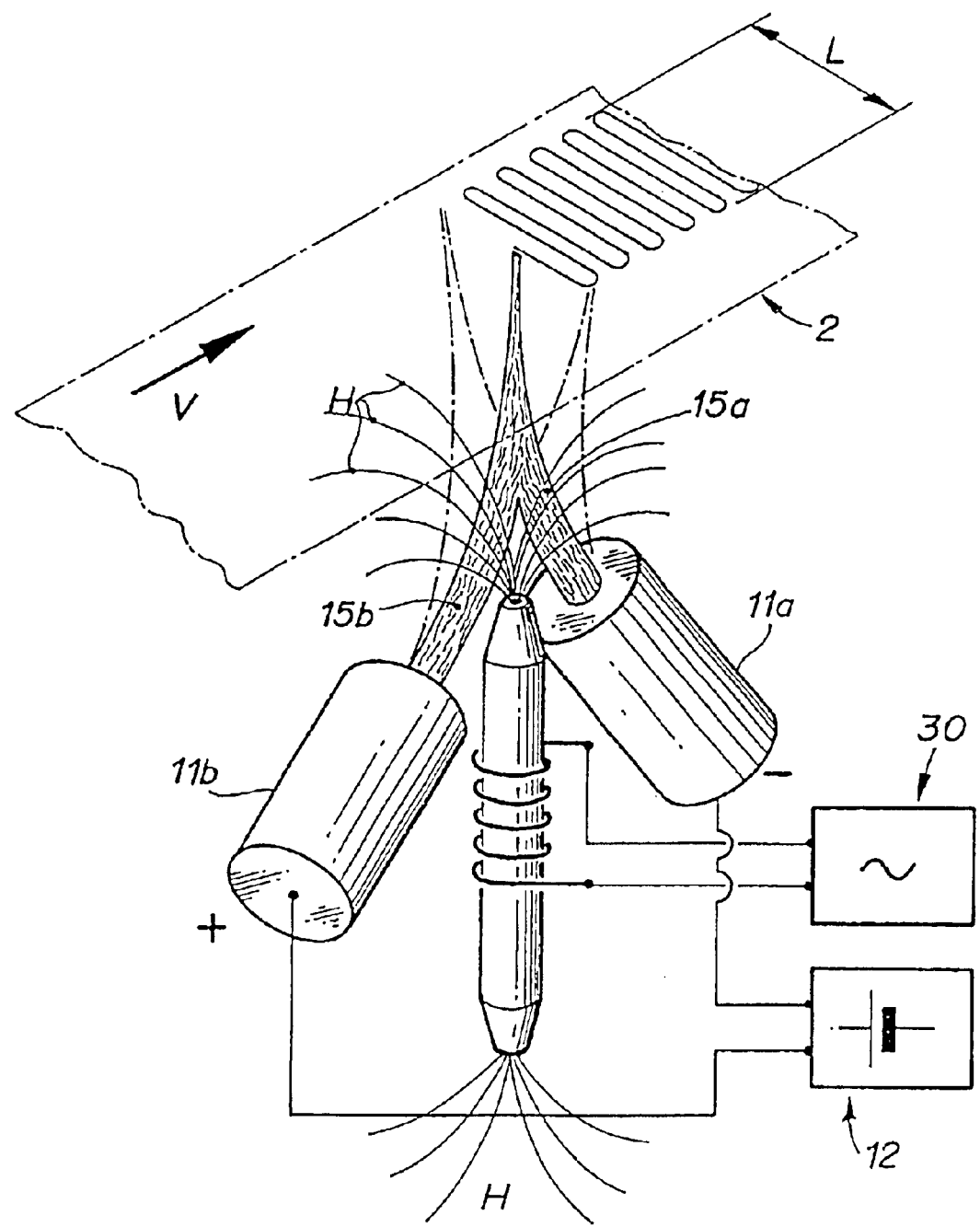
FIG. 9 is a simplified perspective view of an embodiment of the invention, including a device for generating a magnetic field.

In another embodiment of the present invention, illustrated in FIG. 9, the plasma jets are subjected to the action of an alternating magnetic field H, generated by a magnetic field generator 30 of which the lines of force are directed perpendicularly with respect to the lines of flow of the cathodic jets 15a and of the anodic jets 15b. An oscillation of the plasma jet applied to the surface to be treated results therefrom, which is due to the action of Ampere forces and, accordingly, a sweeping of this surface by a plasma jet occurs over a determined width range L, determined by the magnitude of the electrical current and the magnitude of the magnetic field. The frequency v of the oscillations of the magnetic field is selected in such a manner that the plasma covers completely the range of oscillations, namely that:

$$v \leq v/d$$

wherein d is the diameter of the projection of the plasma jet on the treated surface and v is the speed of motion of the surface to be treated, relative to the plasma generators 11a, 11b.

Figures 12A, 12B:
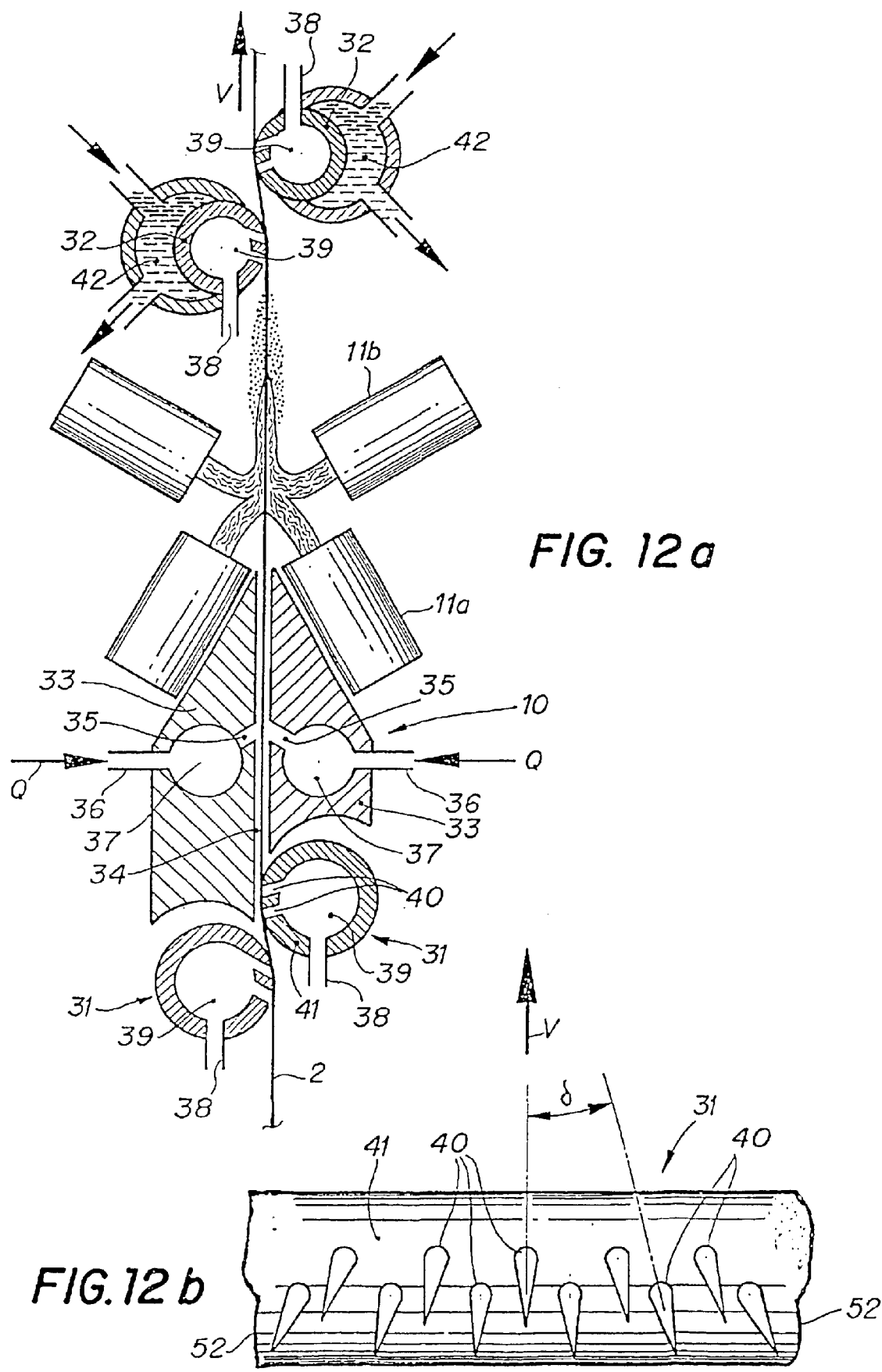

FIG. 12a shows an advantageous embodiment for the treatment of long thin foils, such as aluminium foils, which includes plasma generators 11a, 11b, hydrodynamic bearings 31, 32 and a device 10 for stabilising the flow of the air. The assembly shown in FIG. 12a can be part of a treatment installation, such as, for example the installation shown in FIG. 2.

The stabilising device 10, positioned in the vicinity of the plasma generators 11a, 11b not only makes it possible to make the flow of air on the surface of the foil laminar, in order to prevent a crumpling of the same, but also to adjust and to control the amount and the composition of the gas mixture in the treatment zone. It includes two bodies 33 forming a narrow gap 34 for the passage of the foil. The mixtures of additional reactive gases Q are introduced into the gap via orifices 35 in each body 33, connected to an inlet 36 via a manifold 37 which enables a good distribution of the additional gas into the orifices.

The aerodynamic bearings 31, 32 arranged upstream and downstream of the stabilisation device and of the plasma generators and on each side of the foil with a slight overlap, make it possible to tauten, to stabilise and to position the foil to be treated with respect to the stabilising devices 10 and the plasma generators. The aerodynamic bearings offer the advantage of fulfilling the above-mentioned functions without any significant increase in the friction forces. Each bearing includes an air inlet 38 supplied with pressurised air and connected, via a manifold 39, to outflow orifices 40, directed counter-currently with respect to the motion of the foil, to create an air cushion between the foil and the body of the bearing 41. The outflow orifices 39 have, preferably, a shape that is longitudinal and they are distributed along the width of the foil. The angle δ between the longitudinal direction of the orifices and the direction of motion v of the foil is close to 0° at the centre of the foil and increases towards the lateral edges 52 as illustrated in FIG. 12*b*, possibly up to 90°.

The downstream bearings 32 can be cooled by a water circuit, in such a manner as to cool both the bearings and the foil, downstream of the treatment zone.

Figures 10A, 10B:
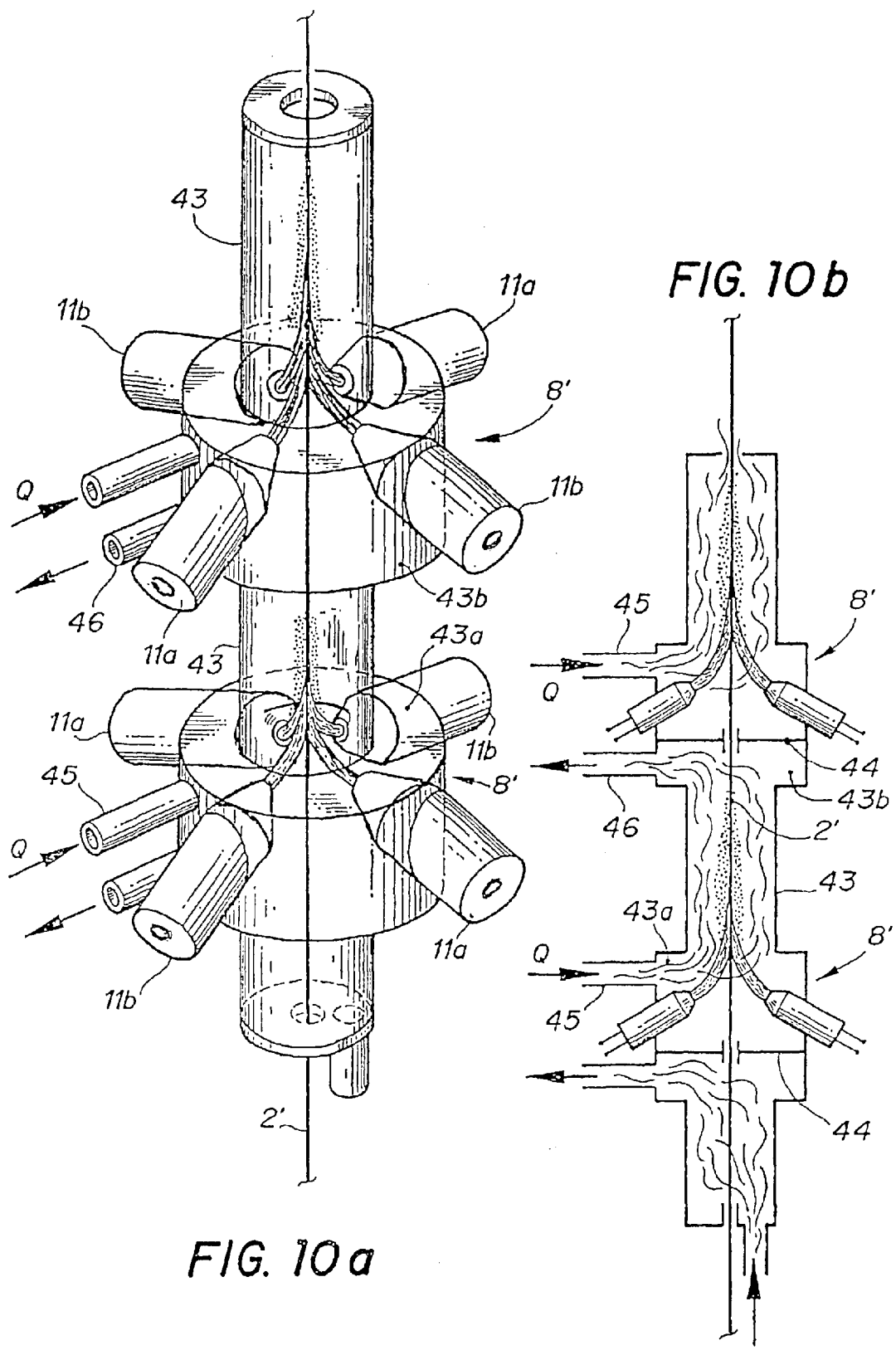

Referring to FIGS. 10*a* and 10*b*, an exemplary embodiment for the treatment (cleaning, stripping, annealing, superficial formation of an alloy, deposition of a film) of wires is shown. The treatment installation includes plasma jet generators 11, arranged around the wire 2' to be treated. The generators are, preferably, arranged symmetrically around a wire and the number of plasma jets is of four, or more. Preferably, the cathodic jets 11*a* and the anodic jets 11*b* are arranged in an alternate manner. It is however possible to have other configurations and even a number of cathodic jets different from the number of anodic jets, without departing from the scope of the invention.

The device can include one or several series 8' of plasma generators 11 arranged along the wire, each series 8' including, at least, one cathodic generator and, at least, one anodic generator. Each series can be separated from the following one by a tubular reactor 43, for example of a cylindrical form, for isolating the wire from the ambient atmosphere and of a length which is approximately equal to the distance over which the plasma remains active. The tubular reactor is provided with an inlet manifold 43*a* and an outlet manifold 43*b* for additional reaction gases, as well as with inlet and outlet guides 44 for guiding the wire during its passage through the device. The wire, during its passage through the device, is stabilised and centred by the guides 43. Advantageously, one can use these guides to impress upon the wire, acoustic or ultrasonic oscillations. The additional reactive gases Q are introduced into the device via inflow conduits 45 and are evacuated via outflow conduits 46.

Figure 13A:
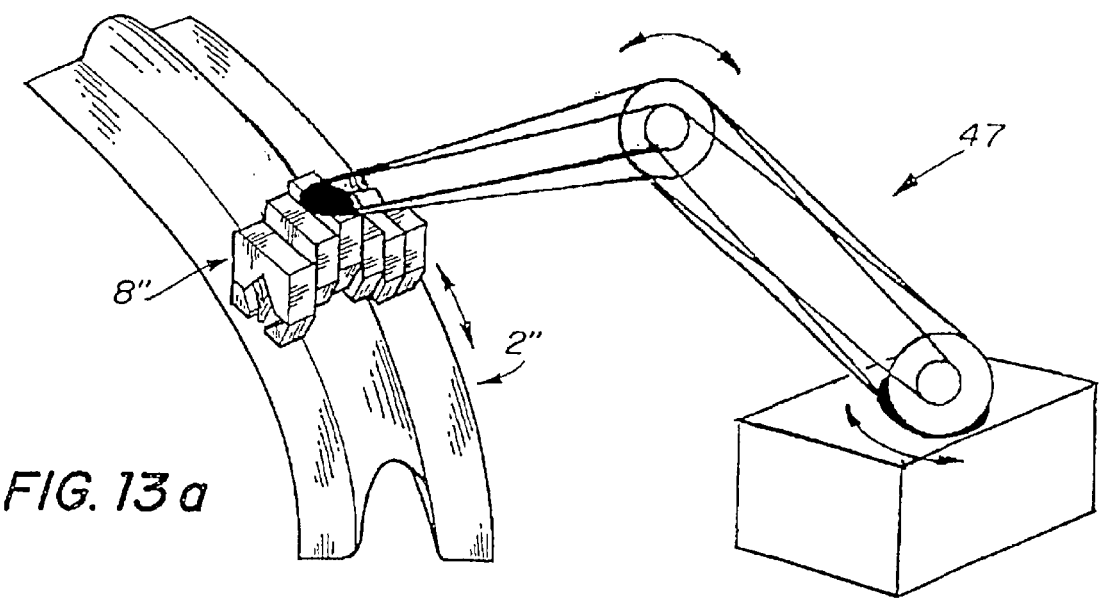
FIG. 13a is a simplified perspective view of an embodiment of an installation for the treatment of objects with a large surface area, such as car body parts made from metal sheets, according to the invention.
Figures 13B, 13C:
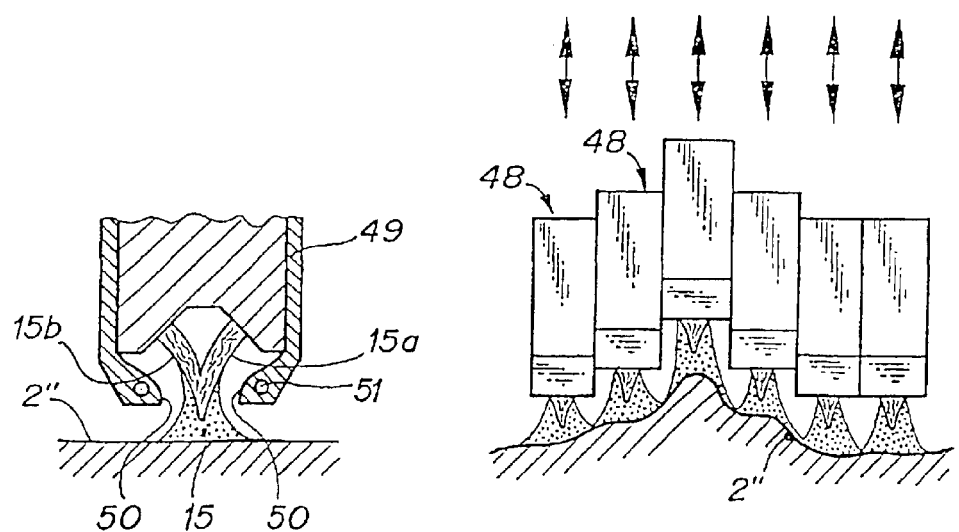

Referring to FIGS. 13*a* and 13*b*, a treatment installation for objects to be treated 2" with a complex surface, such as car body parts made from metal sheets, includes a treatment device 8" mounted on a displacement device 47, such as an industrial robot. The treatment device includes a series of blocks 48 of plasma generators 11*a*, 11*b*, which are movable with respect to each other, in such a manner as to enable the blocks to adapt to a complex surface. Each block can be equipped with a sensor (not illustrated) for controlling the distance between the block and the surface and for controlling a motor (not illustrated) moving the block.

Each block includes, at least, one cathodic jet generator and at least one anodic jet generator. Each block can further include a housing having an opening 50 provided with a cooling circuit 51, which functions to stabilise the plasma jet and to wrap a stabilising stream of gas around the same, thus compressing the plasma 15 directed against the surface to be treated.

EXAMPLES

Non limiting examples of the implementation of the process according to the present invention are given hereafter.

Example 1

Cleaning of an Aluminium Foil of Residues of Roll Grease

Two devices for the treatment by identical plasma jets include each one 10 pairs of anodic and cathodic plasma jets, arranged on both sides of the foil to be treated, in order to treat the two faces of the foil. Two configurations have been tested: one where the two devices are located at the same place of the foil and carry out the treatment of the two faces simultaneously, as illustrated by position I of FIG. 2, and one where the two devices are placed at different locations of the foil and carry out the treatment of the two faces consecutively, as illustrated by positions II or III of FIG. 2. The two configurations differ, in that the temperature of the foil to be treated in the treatment zone is higher for configuration I, since it does not benefit from the cooling by the rollers and from the consecutive treatment of configurations II and III. The treated foil was an aluminium foil of 100 μm of thickness and of 20 cm of width, obtained by rolling.

The treatment parameters were the following:

| | |
|---|---|
| Cathodic current ($I_1$) | 15 A |
| Anodic current ($I_2$) | 10 A |
| Current flowing through the treated material ($I_3$) | 5 A |
| Angle between the axis of the anodic jet and the foil to be treated | 90° |
| Angle between the axis of the cathodic jet and the foil to be treated | 35° |
| Flow rate of the protection gas (Ar) | 0.5 l/min. (each jet) |
| Flow rate of the additional gas | |
| Anodic jet (oxygen) | $Q_1$ = 0.5 l/min. |
| Cathodic jet (air) | $Q_2$ = 2 l/min. |
| Speed of motion of the foil | 3 m/sec |

The results of the treatment were controlled by tests considered as standard, namely the European Standard EN 546-4, as illustrated in FIGS. 7*a* to 7*e*. The result of the treatment received the mark A+, which means that they are better than the best results obtained by conventional cleaning techniques.

In particular, the wettability of the foil was verified by depositing a series of drops of distilled water on the treated surface, in the horizontal position, as illustrated in FIG. 7*a* and by tilting subsequently this surface, as illustrated in FIG. 7*b*.

The uniformity was also verified by depositing a continuous thread of water on a treated surface and by tilting the same, as illustrated in FIG. 7*d*.

These two verifications have made it possible to demonstrate an excellent uniformity of the treatment.

The determination of residual carbon, carried out by the Strölhein method, produced a result lower than 0.1 g/m² of residual carbon.

The surface to be treated was also controlled for possible solid-phase residues, such as powders of oxides or other solid residues, by means of a test carried out by wiping with a hygroscopic cotton wool patch, such as illustrated in FIG. 7*e*. The cotton wool patch used remained clean, which indicates the absence of residues.

The evaluations by electron microscopy (SEM) confirmed the cleanliness of the surface treated, at a scale lesser than 1000 Å/cm.

Example 2

Annealing of a Metal (Aluminium) Foil

| | |
|---|---|
| Item annealed | an aluminium foil having a thickness of 100 μm |
| Device | the current in the foil is nil |
| Current | 20 A |

-continued

| Voltage | 50 V |
|---|---|
| Angle between the plasma jet and the treated surface | α = 30° |
| Angle of slant of the plasma jets | γ = 45° |

A complete annealing is observed for a speed of motion of the foil of 0.6 m/sec.

Figure 8A:
FIG. 8a is an SEM (Scanning Electron Microscope) photograph of an aluminium foil, annealed by a plasma treatment according to the invention.
Figure 8B:
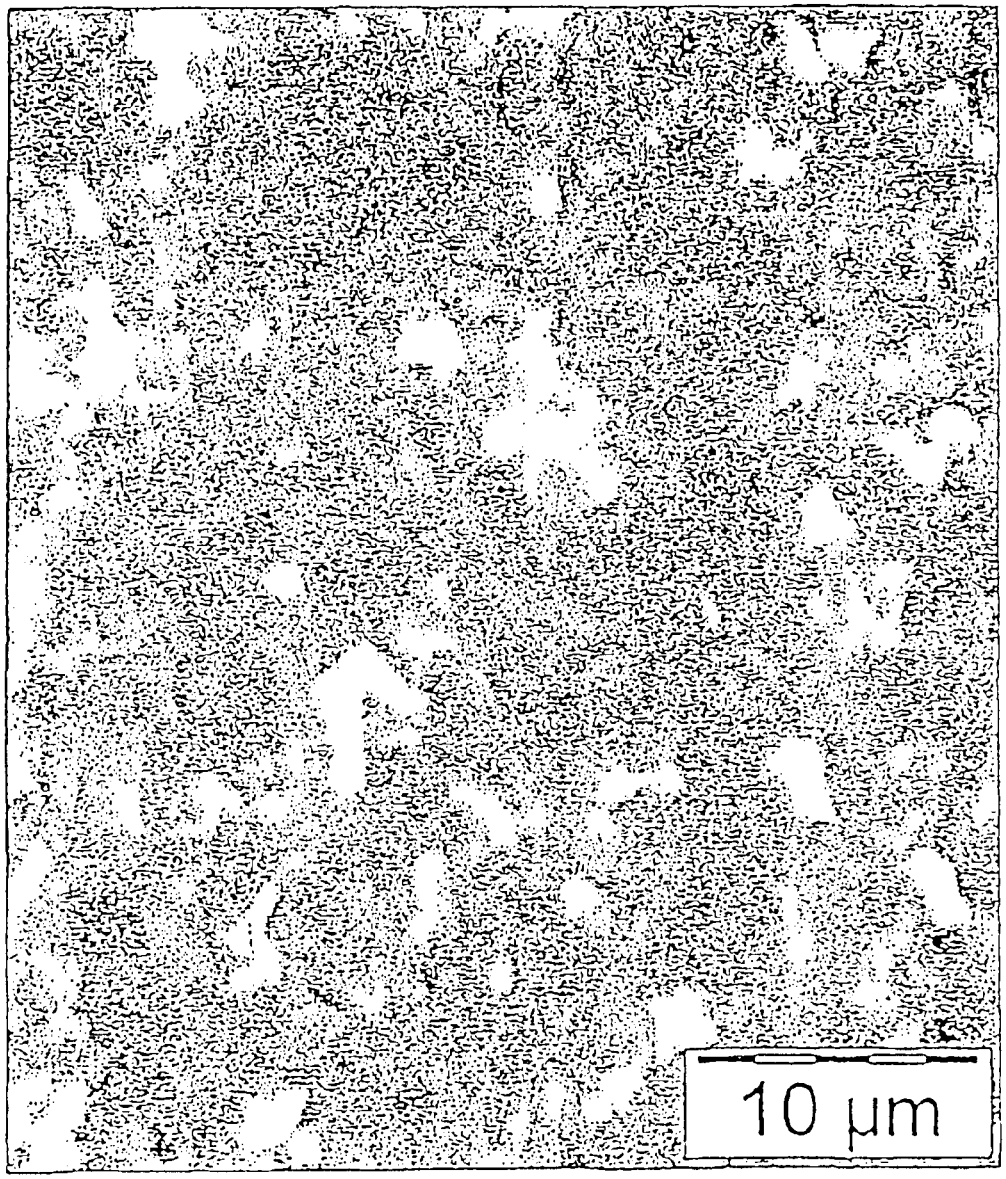
FIG. 8b is an SEM photograph of the surface of a non treated aluminium foil.

The superficial structure of the metal before and after the treatment, when examined by SEM, is shown in the SEM photographs of FIGS. 8b (before) and 8a (after). FIG. 8a shows a granulation characteristic of an annealing.

Figure 8C:
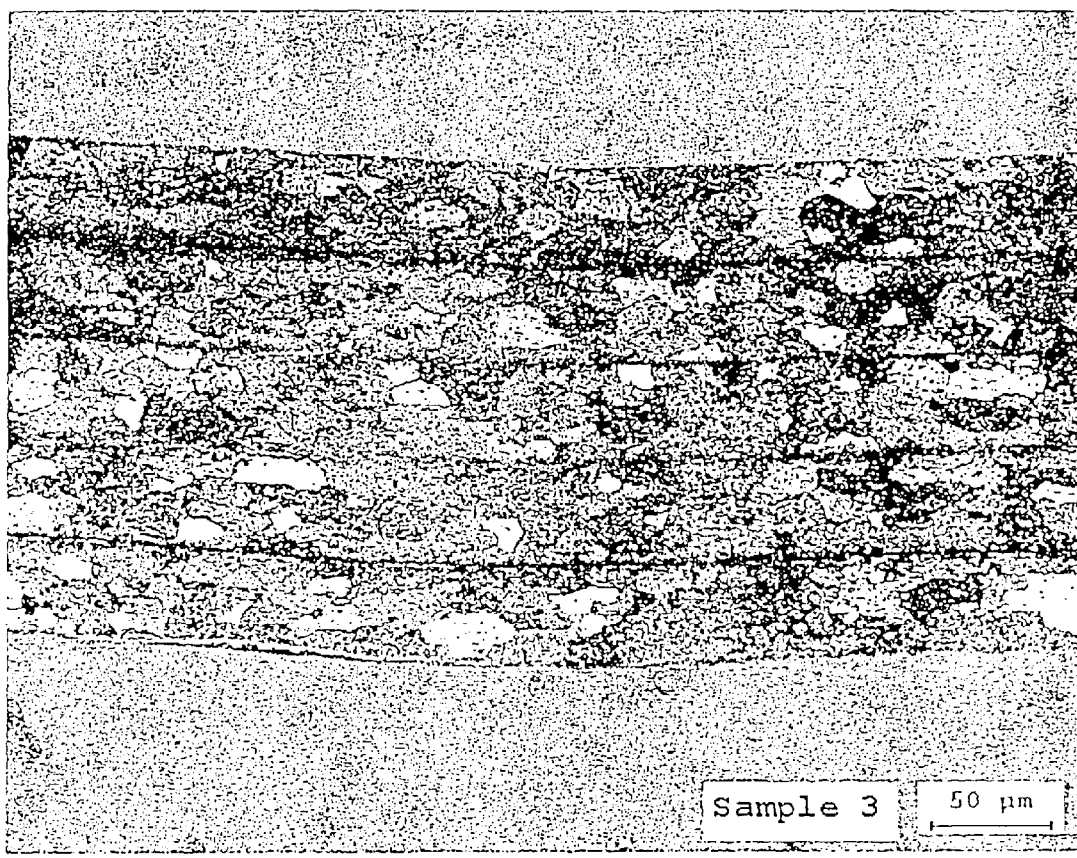
FIG. 8c is an SEM photograph of a cross-section of a stack of aluminium foils treated by the plasma process according to the invention.

FIG. 8c shows a homogeneous structure, also granular, over the whole thickness of the section of the treated foil.

The measured values of the <<bursting>> (ultimate tensile strength combined with the extension) amount to 300±20 kPa. This value corresponds to the best values for aluminium samples annealed according to conventional methods. It was found that the bursting was uniform (±10%) over the whole width of the samples of the treated foils.

Example 3

Sterilisation of a Steel Foil

The sterilisation properties according to a process of the invention were verified by contaminating a steel foil, before the treatment, by four types of micro-organisms. The temperatures necessary for their destruction, by a simple thermal effect, such as a pasteurisation, are given in table 1.

TABLE 1

| Table 1: N° | Micro-organism | Symbol | Thermal destruction temperature for a 1 minute exposure |
|---|---|---|---|
| 1 | *Aspergillus niger* | A. n | 68° C. |
| 3 | *Saccharomyces cerevisiae* | S. c | 78° C. |
| 3 | *Byssochlamys fulva* | B. f | 98° C. |
| 4 | *Bacillus subtilis* | B. s | 140° C. |

Drops of water containing $10^9$ micro-organisms per ml were deposited and dried on the foil before its treatment. The treatment of the contaminated foil was carried out at a constant sweep speed.

The experimental conditions used are in the following (table 2):

TABLE 2

| | | | | | | Table 2 | |
|---|---|---|---|---|---|---|---|
| Condition | Current (A) | | | Gas (flow rate l/min.) | | Sweep speed | Duration of exposure to the plasma |
| N° | Cathode | Anode | Foil | Cathode | Anode | m/sec | (sec) |
| I | 15 | 10 | 5 | Ar (0.5) | Ar (0.5) | 2 | 0.01 |
| II | 20 | 10 | 10 | Ar (1) | Ar (1) | 1 | 0.01 |
| III | 25 | 15 | 10 | Ar (0.5) Air (2) | Ar (0.5) Air (2) | 1 | 0.01 |
| IV | 25 | 15 | 10 | Ar (0.5) $O_2$ (0.5) | Ar (0.5) $O_2$ (0.5) | 0.5 | 0.02 |

The results of the treatment are given in table 3:

TABLE 3

| | Micro- | Count before | Survival after treatment | | | |
|---|---|---|---|---|---|---|
| N° | organisms | treatment | I | II | III | IV*) |
| 1 | A. n | $3.7 \cdot 10^7$ | $<10^0$ | $<10^0$ | $<10^0$ | $<10^0$ |
| 2 | S. c | $5.4 \cdot 10^7$ | $<10^0$ | $<10^0$ | $<10^0$ | $<10^0$ |
| 3 | B. f | $2.9 \cdot 10^7$ | $3.8 \cdot 10^5$ | $<10^0$ | $<10^0$ | $<10^0$ |
| 4 | B. s | $3.9 \cdot 10^7$ | $9.1 \cdot 10^6$ | $4.9 \cdot 10^4$ | $<10^0$ | $<10^0$ |

As shown in table 3, a complete sterilisation, without any deterioration of the material, is obtained under conditions 3, for an exposure time of 0.01 sec, i.e. lower by three orders of magnitude than the duration of a normal thermal treatment.

All the results obtained under conditions IV show a slight alteration of the material, indicating an exposure time which is too high.

Example 4

Deposition of an $SiO_2$ Film on an Al Foil

The same installation as in example 1 was used. The surface to be treated was the face of an aluminium foil of 30 μm of thickness, obtained by rolling. The cleaning (activation) with plasma was carried out according to the present invention.

Three cases of treatment are compared:

a) The parameters of the treatment with a direct current were the following:

| Cathodic current ($I_1$) | 20 A |
|---|---|
| Anodic current ($I_2$) | 12 A |
| Current flowing through the foil to be treated ($I_3$) | 6 A |
| Angle between the axis of the anodic jet and the foil to be treated | α = 90° |
| Angle between the axis of the cathodic jet and the foil to be treated | β = 30° |
| Angle of slant of the plasma jets | γ = 45° |
| Flow rate of the protection gas (Ar) | 0.5 l/min. |
| Flow rate of the additional gas | |
| Anodic jet (Ar + hexamethyldisilane + $O_2$) | $Q_1$ = 0.6 l/min. |
| Cathodic jet (Ar + $O_2$) | $Q_2$ = 2 l/min. |
| Speed of motion of the foil | 0.8 m/sec |

The ellipsometric analysis shows that the treatment has enabled the deposition of a not very uniform (±20) dielectric film of $SiO_2$ of an average thickness of 100 nm. The degree of adhesion is not very satisfactory. The dielectric strength of the film is of $0.2 \cdot 10^6$ V/cm, after the plasma treatment. The $SiO_2$ layer flakes off when a square sample of the treated foil (10 cm×10 cm) is immersed into water and subjected to ultrasonic vibrations of a frequency of 45 kHz and with a power of 300 W.

b) The parameters of the treatment with a direct current are identical to those of case a). An alternating magnetic field of a frequency of 800 Hz and of a magnitude of $1.5 \cdot 10^{-4}$ T applied according to FIG. 13 produces a substantial increase in the uniformity of the treatment (±5%). The other results are practically identical to those of case a).

c) The parameters of the treatment by unipolar current pulses were the following:

| | |
|---|---|
| Magnitude of the cathodic current ($I_1$) | 20 A |
| Magnitude of the anodic current ($I_2$) | 12 A |
| Magnitude of the current in the material treated ($I_3$) | 8 A |
| Respective angles | $\alpha = 30°$ |
| | $\beta = 90°$ |
| | $\gamma = 45°$ |
| Frequency of the unipolar current pulses | 25 kHz |
| Duration of the leading edge of the current pulses | 2 μsec |
| Duration of a pulse | 20 μsec |
| Flow rates of the gas and speed of motion of the foil | see a) |

The ellipsometric analysis shows that the treatment has made it possible to deposit uniformly (±5%) a dielectric film of $SiO_2$ of an average thickness of 180 nm. The degree of adhesion is satisfactory. The $SiO_2$ layer shows no flaking or cracking after having submitted a square sample of the treated foil (10 cm×10 cm) under water during 20 min. to the action of ultrasonic vibrations of a frequency of 45 kHz and of a power of 300 W. The dielectric strength achieved is of $0.3 \cdot 10^7$ V/cm.

What is claimed is:

1. A process of treating a surface of an electrically conductive object with a plasma at atmospheric pressure, including the steps of
   generating plasma jets by plasma generators supplied with an electrical current, whereby at least one of the plasma jets is a cathodic jet and at least one of the plasma jets is an anodic jet,
   displacing said object relative to said plasma generators, and
   applying said at least one anodic jet in a plasma treatment zone on said surface to be treated in the proximity of said at least one cathodic jet such that the anodic jet forms an anodic spot that travels to and fro on said surface to be treated due to current forces.

2. A process according to claim 1, wherein an electrical current for the generation of the cathodic and of the anodic plasma jets is divided into three parts, one, $I_3$, flowing through the object to be treated and the two others, $I_1$, $I_2$, being fed to the anodic and to the cathodic plasma jets.

3. A process according to claim 1, wherein the cathodic jet forms with the surface to be treated an acute angle $\gamma$.

4. A process according to claim 1, wherein the anodic jet forms with the surface to be treated, an angle $\beta$ which is greater than the angle $\alpha$ formed between the cathodic jet and the surface to be treated.

5. A process according to claim 4, wherein the angle $\beta$ between the anodic jet and the surface to be treated approaches or is substantially equal to 90°.

6. A process according to claim 3, wherein the angle $\alpha$ between the cathodic jet and the surface to be treated is between 25° and 60°.

7. A process according to claim 1, including the generation of a series of anodic jets and of cathodic jets, arranged alternately in a transverse direction with respect to a direction of the motion of the object to be treated relative to the plasma generators.

8. A process according to claim 1, wherein the cathodic jets are fed with larger current impulses than the anodic jets.

9. A process according to claim 1, wherein a flow of air or of gas, dragged along by the object to be treated, is separated from the surface to be treated upstream of the treatment zone.

10. A process according to claim 1, wherein a flow of gas dragged by the object to be treated is made laminar, upstream of the treatment zone.

11. A process according to claim 1, wherein the plasma jets are oriented at an acute angle $\gamma$ with respect to the direction of motion v of the object to be treated, relative to the plasma generators.

12. A process according to claim 1, wherein the object to be treated is in the form of a foil.

13. A process according to claim 12, wherein the plasma jets are positioned on both sides of the foil.

14. A process according to claim 13, wherein the plasma jets on one of the sides of the foil are arranged in such a manner as to be offset with respect to the plasma jets on the other side of the foil.

15. A process according to claim 1, wherein the object to be treated is in the form of a wire.

16. A process according to claim 1, wherein one or several jets of additional gas Q is or are directed onto the plasma jets, in order to widen or compress the plasma jets directed against the object to be treated.

17. A process according to claim 1, wherein an acoustic or an ultrasonic vibration is generated on the object to be treated, during the application of the plasma.

18. A process according to claim 17, wherein the acoustic or the ultrasonic vibration is created by a process of plasma generation supplied with electrical current pulses, wherein the duration of the leading edge of the magnitude of the supplied electrical current pulses is sufficiently short to enable the process of increase of the magnitude of the current to be isochoric.

19. A process according to claim 18, wherein the frequency of the electrical current pulses is close or equal to the frequency of the acoustic vibrations.

20. A process according to claim 1, wherein an alternating magnetic field is generated in such a manner that the resulting ampere forces produce a sweeping oscillation of the plasma jets.

21. A process according to claim 20, wherein the frequency v of the oscillations of the magnetic field is equal to, or greater, than the ratio of the relative speed of motion of the object to be treated to the diameter of the plasma jets.

22. A device for carrying out the surface treatment process according to claim 1, wherein it includes at least one cathodic plasma jet generator and at least one anodic plasma jet generator, arranged in such a manner that the anodic jet is applied to a treatment zone of the surface to be treated, in the proximity of the cathodic jet.

23. A device according to claim 22, wherein it includes an electrical circuit for supplying the plasma jets, a loop of the electrical circuit being closed by a portion of the object to be treated and including a means for varying the electrical current $I_3$ flowing through the object to be treated.

24. A device according to claim 22, wherein the anodic plasma jet generator includes an electrode, a stabilising channel, a nozzle for forming the plasma jet and a supply system which makes it possible to introduce and to control the flow, of the gas protecting the electrode and of the additional gases brought to the plasma jet.

25. A device according to claim 22, wherein the cathodic jet generator is directed on the surface to be treated under an angle α which is acute.

26. A device according to claim 25, wherein the anodic jet generator is directed to the surface to be treated at an angle β which is greater than the angle α between the cathodic jet generator and the surface to be treated.

27. A device according to claim 25, wherein the angle α between the anodic jet generator and the surface to be treated approaches or is substantially equal to 90°.

28. A device according to claim 25, wherein the angle α between the cathodic jet generator and the surface to be treated is between 25° and 60°.

29. A device according to claim 22, wherein it includes a series of anodic and cathodic jet generators placed alternately in a transverse direction with respect to the direction of the motion of the object to be treated, relative to the plasma generators.

30. A device according to claim 22, wherein, in the direction which is transverse with respect to the direction of motion v of the object to be treated, the cathodic and the anodic jet generators alternate in such a manner that the axis of each one of the generators of a given polarity is at an equal distance from the axes of the two neighbouring generators, both of the opposite polarity.

31. A device according to claim 29, wherein it includes, at least, two series of plasma jet generators arranged on both sides of the object to be treated, which is in the form of a foil, in such a manner as to treat, simultaneously or sequentially, the two faces of this foil.

32. A device according to claim 22, wherein it includes, upstream of the plasma treatment zone, a device for stabilising air flow.

33. A device according to claim 32, wherein the object to be treated is foil and the stabilisation device includes a body positioned on each side of the foil to form a narrow gap for the passage of the foil, and means for introducing additional gases Q into the gap, in order to control and adjust the gas mixture in the plasma treatment zone.

34. A device according to claim 22 wherein the object to be treated is foil and wherein the device includes downstream of the plasma treatment zone, a device for stabilising the air flow including a cooling system.

35. A device according to claim 22, wherein it includes aerodynamic bearings arranged, respectively, upstream and downstream of the plasma generators.

36. A device according to claim 35, wherein the aerodynamic bearing includes a body with a pressurised air inlet 38, connected via a manifold 39, to outflow orifices 40 directed counter-currently with respect to the motion v of the foil, to create an air cushion between the foil and the body of the bearing.

37. A device according to claim 36, wherein the downstream bearings are cooled with water.

38. A device according to claim 36, wherein the outflow orifices have a longitudinal shape and are distributed along the width of the foil, the angle δ of the longitudinal direction of the orifices with the direction of motion of the foil being close to 0° at the centre of the foil and increasing towards the side edges of the foil.

39. A device according to claim 22, wherein the object to be treated is wire, wherein the device includes several series of anodic and cathodic plasma jets generators, arranged along the wire.

40. A device according to claim 39, wherein each series includes several pairs of anodic and of cathodic jet generators arranged substantially symmetrically about the wire to be treated.

41. A device according to claim 39, wherein each series is separated from the neighbouring series by a tubular reactor.

42. A device according to claim 41, wherein the tubular reactor is provided with a manifold for the supply and with a manifold for the discharge of the additional reactive gases, as well as with inlet and outlet guides for guiding the wire during its passage through the device.

43. A device according to claim 22 wherein the object to be treated is foil or a profiled sheet, wherein it the device includes a series of blocks of plasma generators which are movable with respect to each other, in order to enable adaptation of the blocks to a surface which is complex.

44. A device according to claim 43, wherein the block includes a sensor for controlling the distance between the block and the surface to be treated and for controlling the motor moving the block.

45. A device according to claim 43, wherein the blocks include a housing which has an opening provided with a cooling circuit for stabilising said at least one cathodic plasma jet or said at least one anodic plasma jet, and which makes it possible to surround the same with a stabilising gas stream, to press and direct plasma from said cathodic or anodic plasma jet against the surface to be treated.

46. A process for the treatment, with a plasma at atmospheric pressure, of an object to be treated, including the steps of generating plasma jets with plasma generators, applying the plasma jets to a surface to be treated of the object to be treated, and displacing the object to be treated relative to the plasma generators, wherein at least one of the plasma jets is a cathodic jet and at least one of the plasma jets is an anodic jet, said anodic jet being applied to a treatment zone on said surface to be treated in the proximity of the cathodic jet, and wherein a flow of air or of gas, dragged along by the object to be treated, is separated from the surface to be treated upstream of the treatment zone.

47. A process according to claim 46, wherein said flow of gas dragged by the object to be treated is made laminar, upstream of the treatment zone.

48. A device for carrying out the surface treatment process according to claim 1, including at least one cathodic plasma jet generator and at least one anodic plasma jet generator, arranged in such a manner that the anodic jet is applied to a treatment zone of the surface to be treated, in the proximity of the cathodic jet, the device further including a device for stabilising air flow upstream of the plasma treatment zone.

49. A device according to claim 48, wherein the object to be treated is foil and the stabilisation device includes a body positioned on each side of the foil to form a narrow gap for the passage of the foil, and means for introducing additional gases Q into the gap, in order to control and adjust the gas mixture in the plasma treatment zone.

50. A device for carrying out the surface treatment process according to claim 1, including at least one cathodic plasma jet generator and at least one anodic plasma jet generator, arranged in such a manner that the anodic jet is applied to a treatment zone of the surface to be treated, in the proximity of the cathodic jet, wherein the object to be treated is foil and wherein the device includes downstream of the plasma treatment zone, a device for stabilising the air flow including a cooling system.

51. A device for carrying out the surface treatment process according to claim 1, including at least one cathodic plasma jet generator and at least one anodic plasma jet generator, arranged in such a manner that the anodic jet is applied to a treatment zone of the surface to be treated, in the proximity of the cathodic jet, wherein the object to be treated is foil or a profiled sheet, wherein the device includes a series of blocks of plasma generators which are movable with respect to each other, in order to enable adaptation of the blocks to a surface which is complex.

52. A device according to claim 48, wherein the block includes a sensor for controlling the distance between the block and the surface to be treated and for controlling the motor moving the block.

53. A device according to claim 52, wherein the blocks include a housing which has an opening provided with a cooling circuit for stabilising said at least one cathodic plasma jet or said at least one anodic plasma jet, and which makes it possible to surround the same with a stabilising gas stream, to press and direct plasma from said cathodic or anodic plasma jet against the surface to be treated.

* * * * *